United States Patent [19]

Sequin et al.

[11] 3,963,942
[45] June 15, 1976

[54] SEMICONDUCTOR CHARGE TRANSFER DEVICES WITH DARK CURRENT BACKGROUND CANCELLATION

[75] Inventors: Carlo Heinrich Sequin, New Providence; Peter Van Dyke Wilde, Bernardsville, both of N.J.

[73] Assignee: Bell Telephone Laboratories, Incorporated, Murray Hill, N.J.

[22] Filed: Mar. 6, 1975

[21] Appl. No.: 556,135

[52] U.S. Cl. .............................. 307/221 D; 307/304; 357/24
[51] Int. Cl.² .................. H03K 3/353; H01L 29/78
[58] Field of Search ........... 357/24; 307/221 D, 304

[56] References Cited
UNITED STATES PATENTS

| | | | |
|---|---|---|---|
| 3,814,955 | 6/1974 | Itoh et al. .............................. | 357/24 |
| 3,856,989 | 12/1974 | Weimer ................................. | 357/24 |
| 3,859,518 | 1/1975 | Sander ................................... | 357/24 |

OTHER PUBLICATIONS

Weimer et al., "Video Processing in Charge-Transfer Image Sensors by Recycling . . .", RCA Review vol. 35 (9/74) pp. 341–354.

Weimer et al., "Design and Operation of Charge-Coupled Image Sensors", IEEE Solid State Circuits Conf. Digest Tech. Papers (2/73) pp. 132–133.

Levine, "Measurements of CCD Transfer Efficiency by Use of Feedback . . . ", IEEE J. Solid-State Circuits vol. SC-8 (4/73) pp. 104–108.

*Primary Examiner*—William D. Larkins
*Assistant Examiner*—Gene M. Munson
*Attorney, Agent, or Firm*—D. I. Caplan

[57] ABSTRACT

In order to reduce the steady dark current background effect on the output sequence of charge packets in a semiconductor charge transfer device, each charge packet on its first arrival at the output end of a transfer path is inverted with respect to a suitable reference level; and the inverted charge packet is then recirculated through the same transfer path for subsequent detection on its next arrival at the output end of the path.

8 Claims, 10 Drawing Figures

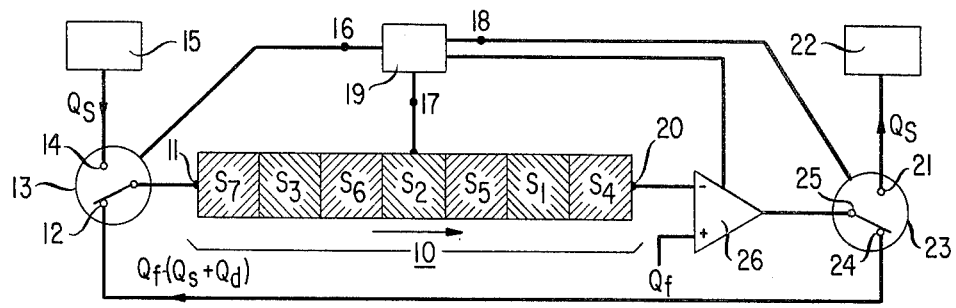
FIG. 1
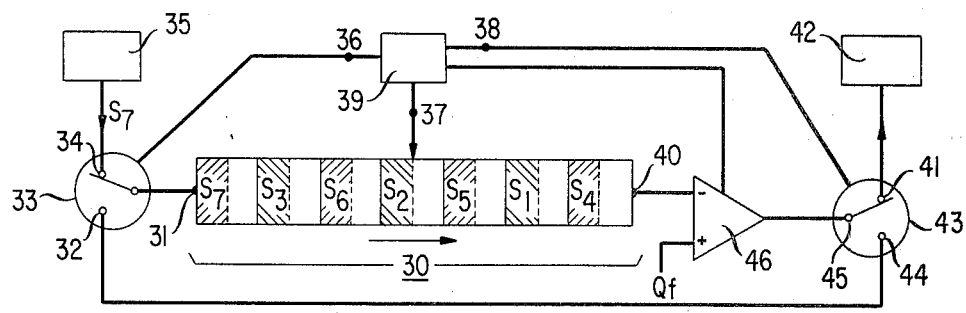
FIG. 2.1
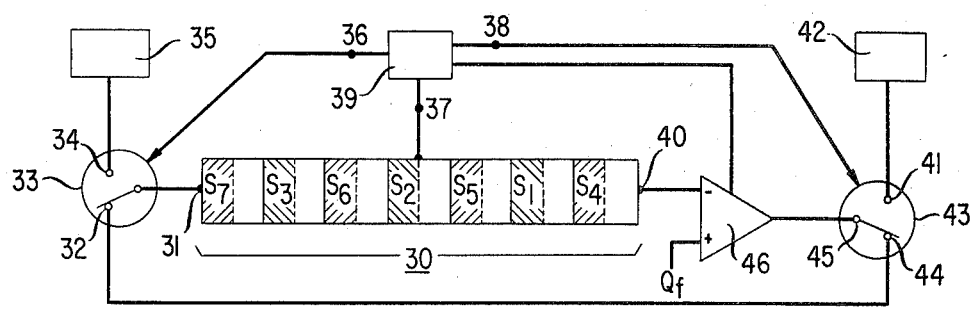
FIG. 2.2
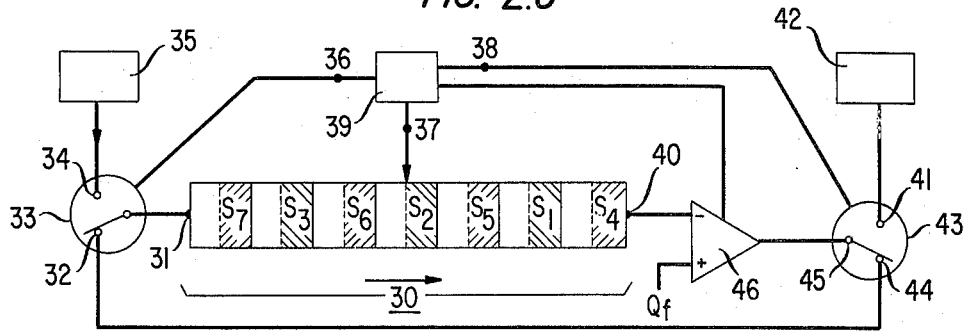
FIG. 2.3

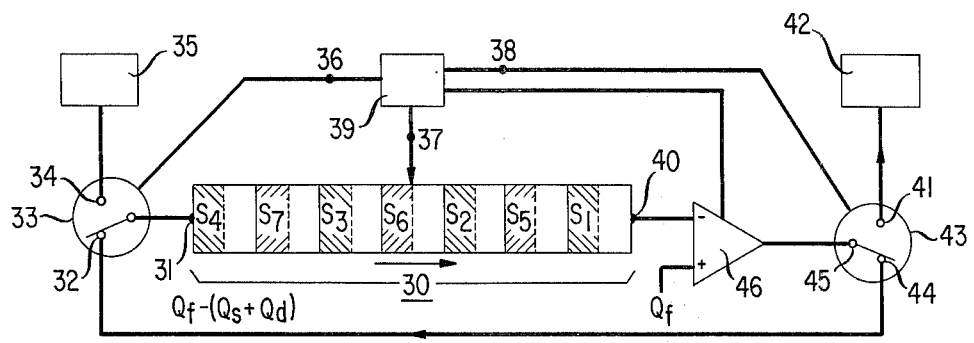
FIG. 2.4
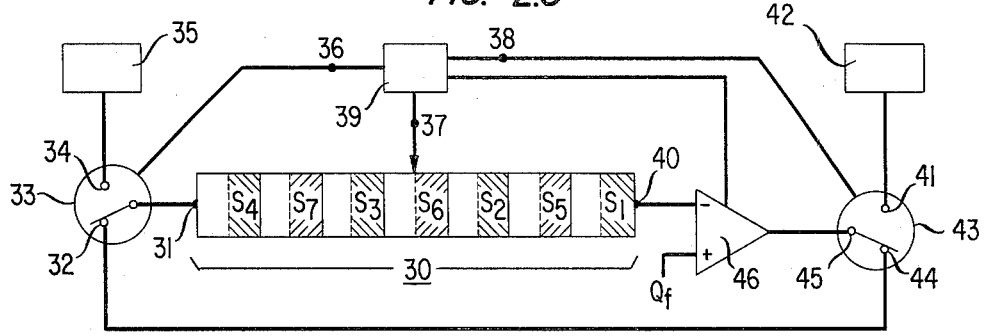
FIG. 2.5
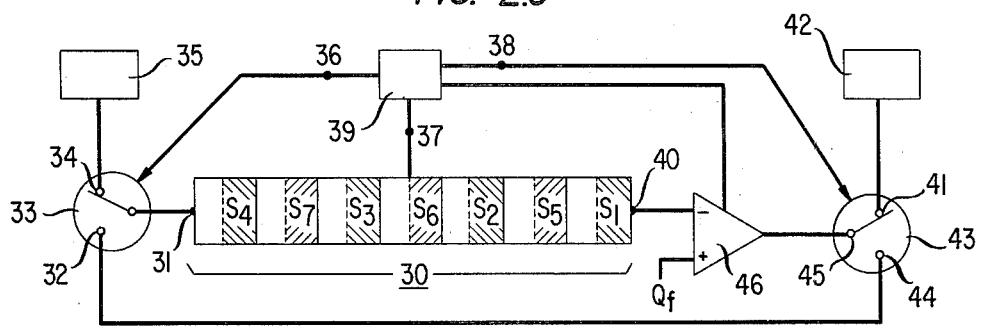
FIG. 2.6
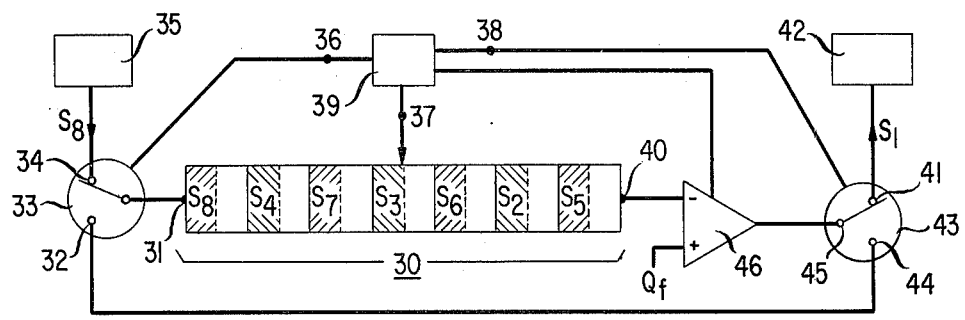
FIG. 2.7

SEMICONDUCTOR CHARGE TRANSFER DEVICES WITH DARK CURRENT BACKGROUND CANCELLATION

FIELD OF THE INVENTION

This invention relates to the field of semiconductor apparatus, more particularly to semiconductor charge transfer devices.

BACKGROUND OF THE INVENTION

Semiconductor charge transfer devices (CTD) involve electrically controlled sequential shift-register operations on localized charge packets (accumulations) in a semiconductor medium.

Charge transfer devices in the semiconductor art fall into two main categories, the so-called "charge coupled device" (CCD) and integrated circuit versions of the "bucket brigade device" (BBD). In either version, a spatially periodic electrode metallization pattern on a major surface of a semiconductor body coated with oxide defines a sequence of integrated MOS (metal-oxide-semiconductor) type capacitors, so that localized electrical charge "packets" (accumulations) in the semiconductor can be shifted through the semiconductor sequentially between adjacent MOS capacitors by sequential (clock) electrical voltage pulses applied to the electrodes. These charge packets are initially injected at the input end of a chain of such MOS capacitors, in accordance with a stream of digital or analog information. For example, in the binary digital case, the stream of information is in the form of injected charges versus no injected charges at appropriate moments of the clock voltage pulse sequence. In general, there are as many MOS-type capacitors (storage sites) per "storage cell" as there are phases in just one full cycle of the voltage pulse sequences which drive the CTD. Thus, in any event, a semiconductor charge transfer device is a form of shift-register device.

In the CCD version of a CTD, the charge packets in the semiconductor, when not being shifted, are localized as isolated inversion layers at the oxide-semiconductor interface. These localized charge packets are sequentially shifted through the semiconductor under the influence of the clock. In the BBD version, the injected charges (when not being shifted) are localized as excess majority charge carriers in the diffused (or implanted) regions of localized P-N junctions previously fabricated at the oxide-semiconductor interface; and this excess charge (not necessarily the same charge carriers originally injected) is shifted through the semiconductor under the influence of the clock.

It should be understood of course that ordinarily in present day semiconductor charge transfer devices, the semiconductor medium is silicon and the oxide is silicon dioxide; however, other suitable semiconductor-insulator combinations may be used in general. Thus, the term "oxide" in connection with CTDs can refer to any such suitable insulator.

An important type of CTD involves the serial-parallel-serial transfer path configuration. Such a configuration comprises an initial horizontal row line of say M cells, a rectangular matrix of M columns and say N rows of cells, and a final horizontal row line of M cells, where both M and N are assumed to be integers for the sake of ease of explanation only. In operation, a sequential stream of say M packets is first sequentially shifted longitudinally through a first horizontal row line of M successive transfer cells until each of the M cells is filled with a different one of the M packets of the stream. Then, all of these M packets are simultaneously shifted transversely through a different vertical column line. Each column has N successive cells, thereby forming the MxN matrix of cells, M columns and N rows (plus the initial and the final row lines). After the packets have been thus shifted through the N column cells, each of the packets is fed into a different cell of the final horizontal row line of M cells. Then, the packets in this final horizontal row line are sequentially shifted longitudinally (through this final row line itself) to an output detector. Each and every packet is thus delayed by the serial-parallel-serial array by an amount corresponding to shifting through the same total number of cells, that is, (M+N+1) cells. However, each column of the cell can suffer from a different total amount of "dark current" source strengths and thereby impose a different "dark current background" on each of the M packets while being transferred through a different one of the M columns.

Moreover, even if the dark current were the same throughout all the cells in the M columns, different packets would still suffer different backgrounds due to the dark current background sources along the initial and along the final horizontal row lines. This difference in backgrounds occurs even if these dark current sources also all have the same strength in each cell, owing to the lack of symmetry of dark current effect on the packets in the final row line with respect to the initial row line. This lack of symmetry arises because some of the dark current charge buildup generated in the initial row line is being constantly removed by ("dumped into") the substrate at the end of this initial row line located on the opposite end thereof from the input end, whereas all of the charge due to dark current generated in the final row line ultimately appears at the detector at the output end of the final row line. Thus, even in the case of an array with each cell having the same dark current (uniformly spatially distributed sources of dark current background), a ramp of dark current background is built up in the initial row line, whereas the dark current background contribution of the cells in the final row line is the same for all packets. Therefore, the charge packets which are shifted through more cells of the initial row line (and hence correspondingly fewer cells in the final row line) suffer from more background charge on arrival at the detector than the charge packets which are shifted through more cells of the final row line (and correspondingly fewer cells of the initial row line).

In the case of linear transfer path configurations in a semiconductor CTD, where each and every charge packet passes through the same transfer path, the amount of dark current charge added to the packets will vary with the temperature of device. Accordingly, unavoidable device temperature variations tend to jeopardize the stability even in the case of linear path transfer devices.

It would therefore be desirable to have means for reducing the background due to dark current sources in semiconductor charge transfer devices, whether of the serial-parallel-serial or linear transfer path configuration.

SUMMARY OF THE INVENTION

In order to reduce the steady dark current background, each charge packet upon arriving at the output end of a transfer path is detected and inverted with respect to a reference level, and then recirculated through the same transfer path. Thereby, upon arrival once again at the output end of the transfer path, the effective background contribution in the recirculated inverted charge packet has been canceled out by reason of the inverted type of recirculation through the same transfer path where the same background contribution is imposed upon the inverted charge packet. This recirculated inverted charge packet is then free of background, and is thus an inverted delayed representation of the original input signal. For convenience, this recirculated inverted charge packet is again inverted, thereby producing an output charge packet as an uninverted delayed representation of the input injected packet after two passes through the same transfer path. Thereby, dark current background has been canceled by virtue of the two passes.

In symbols, if $Q_s$ is the input charge packet, and $Q_B$ is the undesired background effect, then $Q_s + Q_B$ is the output after a single pass. Denoting the reference level by $Q_f$, then the inverted signal $Q_I$ to be recirculated is given by:

$$Q_I = Q_f - (Q_s + Q_B). \quad (1)$$

After suffering the background due to the second pass, the recirculated inverted output signal thus becomes:

$$Q_f - [(Q_s + Q_B) - Q_B] = Q_f - Q_s. \quad (2)$$

Thus, after the second pass, the output is independent of dark current background, and thus is a faithful (though inverted) representation of the input signal, delayed by two passes through the transfer path. Finally, upon once again (optionally) inverting the output, the final result is just:

$$Q_f - (Q_f - Q_s) = Q_s. \quad (3)$$

Thus, the final result is an output signal in which two backgrounds, accumulated in any charge packet during the two passes through the same transfer path, are canceled. Advantageously, $Q_f$ corresponds approximately to the charge of a fully charged cell, with sufficient margin of typically about 10 percent to 20 percent above the highest injected signal, in order to be able to cancel out a dark current background corresponding to this margin.

In a specific embodiment of the invention, a semiconductor charge transfer device, having a linear transfer path with an input initial cell and output final cell, contains an advantageously odd number of transfer stages. At the input end of the device, during each alternate driving clock cycle, signal input charge packets are injected into the initial cell; whereas, during all the remaining clock cycles, charge packets are detected, inverted and fed back from the output final cell into the input initial cell. Moreover, at the output end of the device, during each said alternate clock cycle, the charge packet then at the output final cell is detected, inverted and fed as the desired signal output to a utilization means.

In another embodiment of the invention, a semiconductor charge transfer device includes a pair of substantially identical serial-parallel-serial transfer path configurations. Each such serial-parallel-serial configuration includes an input row line of M cells together with a rectangular matrix array of MxN cells (M columns, N rows) and an output row line of M cells. The M columns in the array are arranged such that each column is fed by a different one of the M cells of the input row line and such that each column contains N (advantageously an even number) of successive row cells, and the output row line of M cells is arranged such that each cell therein is fed by a different one of the M columns. Each of these serial-parallel-serial transfer device configurations is operated complementary to the other as follows. The initial cell of one configuration is fed a signal stream from a signal source corresponding to typically a whole row line of M bits of information at a time, under the control of a charge transfer driving clock. Thereby, the input row line is filled with charge packets corresponding to the signal stream. While this is being done, the output row line is sequentially detected, inverted and fed as output signal to a utilization means; whereas simultaneously, the output row line of the other serial-parallel-serial configuration is detected, inverted and fed back as an input signal to the initial cell of the input row line, thereby filling this input line with a whole line of (inverted) charge packets on this second passage through this other configuration. Next, each serial-parallel-serial configuration undergoes a conventional shift by one cell of whole rows in the MxN matrix transversely in the column direction; and then again output is taken from, and input is fed to, each configuration with the roles of the one and the other configurations being reversed. These cycles are repeated, over and over, so that at any time while one configuration is delivering charge packets to the utilization means after two passages (the second passage being of inverted feedback), the other configuration is feeding back inverted charge packets to its own input row line. Moreover, instead of feeding in and feeding back a single whole row line at a time, an entire matrix of charge packets can be similarly fed in to one configuration, while read from and fed back (inverted) to the other configuration during an uninterrupted time interval, thereby providing an entire rectangular array ("frame store") sequence of output to each of the utilization means. In any event, by using the pair of configurations delivering either one line or one frame at a time, a continuous output stream of delayed signal is obtained characterized by dark current background suppression (cancellation).

BRIEF DESCRIPTION OF DRAWINGS

This invention, together with its features, advantages and objects, may be better understood from the following detailed description when read in conjunction with the drawings in which:

FIG. 1 is a schematic diagram of a linear path semiconductor charge transfer device with dark current background cancellation, in accordance with an illustrative embodiment of the invention;

FIGS. 2.1 through 2.7 show, in sequence, various stages of a cycle in the operation of a two-phase linear path semiconductor charge transfer device with dark current cancellation, in accordance with a specific embodiment of the invention;

DETAILED DESCRIPTION

Figure 3:
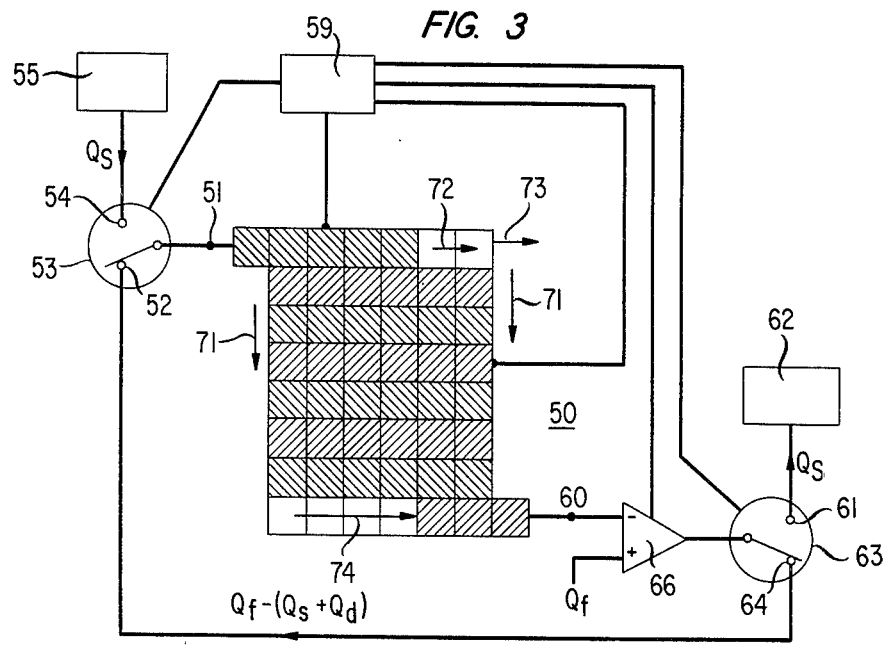
FIG. 3 is a schematic diagram of a serial-parallel-serial semiconductor charge transfer device with dark current background cancellation, in accordance with another illustrative embodiment of the invention.

FIG. 1 shows a semiconductor transfer device 10 with a linear transfer path containing seven cells, by way of illustration only. The transfer path is along the direction from left to right, with an input terminal 11 on the left-hand side of the device 10 and an output terminal 20 on the right-hand side of this device. The input terminal is connected to the common pole of a single pole-double throw switch 13 having a feedback throw terminal 12 and an input signal throw terminal 14. The condition of the throw of the switch 13 is controlled by the voltage of a first terminal 16 of a clock control voltage source means 19. The throw terminal 14 is fed by an input electrical signal charge $Q_s$ in a predetermined input signal stream from an input electrical signal source 15. The transfer of charge through the device 10 is controlled by a second terminal 17 of the voltage source 19, which supplies a sequence of driving clock pulses for transferring the charge packets, as known in the art, so that each charge packet advances one full cell toward the right during each clock pulse cycle. The output of the device 10 at terminal 20 is fed to a first input terminal (labeled with a minus sign in FIG. 1) of a difference amplifier 26. As known in the art, this difference amplifier is keyed to the control source 19, so that the output of this amplifier at terminal 25 during each driving clock cycle of the device 10 is representative of the difference between the outpt of the device 10 during each charge transfer driving clock cycle and a reference charge $Q_f$ supplied during each clock cycle to a second input terminal (labeled with a plus sign in FIG. 1) of this difference amplifier 26. The charge $Q_f$ is advantageously about 10% to 20 percent larger than the maximum injected signal charge packet, thereby providing for cancellation of backgrounds as high as 10% to 20 percent of the maximum injected signal charge packet. Also, the reference charge $Q_f$ provides some bias charge in the feedback, which is advantageous for enhancing the transfer efficiency in surface channel charge coupled devices. A common pole 25 of a single pole-double throw switch 23 receives the output of the difference amplifier 26. This switch 23 includes a feedback throw terminal 24 connected to the feedback throw terminal 12 of the switch 13, and an output signal throw terminal 21 connected to utilization means 22 for detecting and utilizing the (corrected) output signal charge $Q_s$ received from this output throw terminal 21.

The seven cells of the device 10 are labeled with signals being stored and transferred $S_1, S_2, S_3, \ldots, S_7$, the subscripts being sequential in accordance with the chronological sequence of introduction of these signals into the device 10, the earliest such signal being $S_1$ and the latest signal being $S_7$. The cells which contain signals on their first passage through the device 10 are shaded with parallel lines slanting from bottom-left to top-right, and signals on their second passage through the device are of the opposite slant of the shading.

In operation, the switches 13 and 24 select and control the input to, and output of, the device 10. More specifically, the input to the device 10 at terminal 11 during every other full cycle of the clock (at terminal 17) is selected to be fed from the input signal source 15 by means of the throw of the switch 13 to its throw terminal 14, while the input to the device 10 is selected during the remaining full cycles to be fed back from the output terminal 20 of the device 10 through the difference amplifier 26 by means of the throw of the switch 23 to its throw terminal 24. The strength of the feedback signal is, as indicated in FIG. 1, represented by $Q_f - (Q_s + Q_d)$, where $Q_d$ is the dark current background acquired on the first passage through the device 10. Also, during the said every other full clock cycle, the switch 23 is thrown to its terminal 21 in order to feed the (corrected) output signal $Q_s$ to the utilization means 22. Thereby, the device 10 is filled at any moment by the sequence $S_7, S_3, S_6, S_2, S_5, S_1,$ and $S_4$, as indicated in FIG. 1. Thus, each such signal upon arriving at the outpt terminal 20 of the device 10 after its first passage contains dark current background $Q_d$, so that this output signal is represented by $Q_s + Q_d$; whereas, each signal after its second passage acquires substantially the dark current background $Q_d$ and is therefore represented by $Q_f - (Q_s + Q_d) + Q_d = Q_f - Q_s$ at the output terminal 20 of the device 10, and by $Q_f - (Q_f - Q_s) = Q_s$ at the common pole 25 after having been operated upon by the difference amplifier 26.

It should be understood that, while the switches 13 and 23 are both shown as thrown in the feedback position (terminals 12 and 24), at other times during a clock cycle these switches are thrown into the input and output positions corresponding to throw terminals 14 and 21, respectively. Moreover, instead of arranging the switching so as to have the cells in the path spatially alternating with charge packets on their first and second passages through the device 10, the switching can produce the condition of the device where the first M cells contain charge packets on their first (or second) passage, the second M cells on their second (or first) passage, etc.

In order to understand more specifically the operations involved in this invention, it is advantageous to consider its operation in a two-phase linear array type of charge transfer device 30, as illustrated in FIGS. 2.1 through 2.7. The device 30 can take the form of a twophase charge coupled device as described, for example, in U.S. Pat. No. 3,651,349 issued on Mar. 21, 1972 to D. Kahng and E. H. Nicollian. Many of the elements in these FIGS. 2.1 - 2.7 are similar or identical to those in FIG. 1; accordingly, they have been labeled with the same reference numerals plus twenty. In FIGS. 2.1 - 2.7, arrows in any of these drawings from the control voltage source 39 to the device 30 represent a shifting of charge packets by one transfer site (one-half cell) from the previous drawing, and arrows from control source 39 to the switches 33 or 43 represent a change in throw of these switches.

Each of the seven cells of the device 30 is divided into two sites as indicated by a dotted vertical line. At the moments indicated in FIGS. 2.1 - 2.7, each cell contains the corresponding signal charge packets $S_1, S_2, \ldots, S_7$ either in the left-hand or the right-hand site of such cell. By the time the state indicated in FIG. 2.7 is reached, however, the first injected signal packet $S_1$ has passed out of the device 30 into the utilization means 42, and a fresh signal packet $S_8$ has just been injected into the left-hand-most cell.

As shown in FIG. 2.1, a convenient starting point of the condition of the cells, the left-hand site of each cell, is characterized by a signal charge packet $S_1, S_2, \ldots, S_7$, the subscript representing the time order of injection of these packets into the device 30 from the signal input source 35. Accordingly, $S_7$ has just been injected at input terminal 31 by reason of the enablement furnished by the indicated throw position of the switch 33 to throw terminal 34. Since $S_7$ is now on its first passage through the device 30, the shading of the site containing $S_7$ slants from bottom-left to top-right, as opposed to those signal packets on their second passage through the device 30 which are shaded top-left to bottom-right.

As indicated in FIG. 2.2, the control source 39 then throws the switches 33 and 43 into the feedback position, that is, to contact with throw terminals 32 and 44, respectively. Next (FIG. 2.3), the control source 39 shifts the charge packets in the device 30 by one site toward the right. Then another shift, by one more site to the right, (FIG. 2.4) is produced by the control source 39; thereby causing the feedback of $Q_f - (Q_s + Q_d)$, with $Q_s$ corresponding to $S_4$, during the transition of the device 30 from its charge packet condition shown in FIG. 2.3 to the condition shown in FIG. 2.4. Next follows still another shift of by one site, thereby resulting in the configuration of charge packets shown in FIG. 2.5. Then the control source 39 throws the switches 33 and 43 to their respective throw terminals 34 and 41, as shown in FIG. 2.6, in order to enable during the next shift (FIG. 2.7), respectively, the subsequent injection of a new charge packet $S_8$ into the device 30 from input signal source 35 and the feeding of the first charge packet $S_1$ to utilization means 42. At this stage in the cycle represented in FIG. 2.7, the condition of the device 30 is back to what it was in FIG. 2.1, except that now each cell contains signal packets which are later in time by just one full cycle which is then to be repeated. It should be noted that this scheme requires an odd number of cells in the linear array of cells in the device 30.

FIG. 3 illustrates another embodiment of the invention, this one in connection with a serial-parallel-serial type of semiconductor charge transfer device 50. The transfer path is first horizontally along the top row line, second vertically down the various column lines, and then horizontally along the bottom row line as indicated by arrows 72, 71 and 74. Many of the elements in FIG. 3 are similar or identical to those in FIG. 1 and have been assigned the same reference numerals plus 40.

Arrows 71 on either side of the device 50 indicate the direction of passage of whole horizontal lines of charge packets, each line containing six different cells for purposes of illustration, as in the ordinary parallel shifts by control clock pulse source means (not shown) of conventional line-by-line frame store shift registers. Charge packets on their first passage are indicated by the bottom-left to top-right slant of shading, while charge packets on their second (final) passage are shaded top-left to bottom-right. By suitable switching to be described, whole row lines are made to alternate in shading, as shown. Input of a whole horizontal row line of charge packets is obtained by throw of the switch 53 to terminal 54, in order that the input signal source 55 can feed each horizontal line into the top row of the device 50, in accordance with the direction of arrow 72. After a whole such line is fed to this top horizontal row line, this whole horizontal line is shifted downwards by one cell, as each of the other horizontal lines is similarly shifted by one cell downwards in the direction of arrows 71. Thereby, in particular, the bottom row is filled with a horizontal row line of charge packets from the next-to-bottom row. Then the bottom line is fed to the difference amplifier 66 in accordance with the direction of arrow 74 while the top row is filled with a new line of information $Q_f - (Q_s + Q_d)$ by reason of the throw of the switch 63 to terminal 64 and switch 53 to terminal 52 (FIG. 3) for feedback. Output to utilization means 62 is obtained when the bottom row is filled with packets on their second passage, at which time switch 63 is thrown to terminal 61 (while switch 53 is thrown to terminal 54 for input). It should be noted that whereas the number of cells in each horizontal row line can be either even or odd, the total number of cells in any vertical column should be an even integer. Arrow 73 indicates the shift "dumping" (into the substrate) effect of dark current background being accumulated in cells to the right of the "wave-front" of packets entering the top row line, that is, prior to the arrival of the extreme right-hand packet being shifted along the direction of arrow 73. However, no such "dumping" effect takes place at the bottom row, thereby producing some asymmetry in the dark current background even in the case of a completely spatially uniform distribution of dark current sources in the semiconductor body in which the device 50 is built. Thus, by reason of the inversion effect produced by difference amplifier 66 and the passage of each packet through the device 50 just twice (once inverted), the output at terminal 61 fed to utilizaion means 52 is corrected for dark current background insofar as it is not time varying, in accordance with the same type of cancellation principle discussed previously in connection with the device 10.

Figure 4:
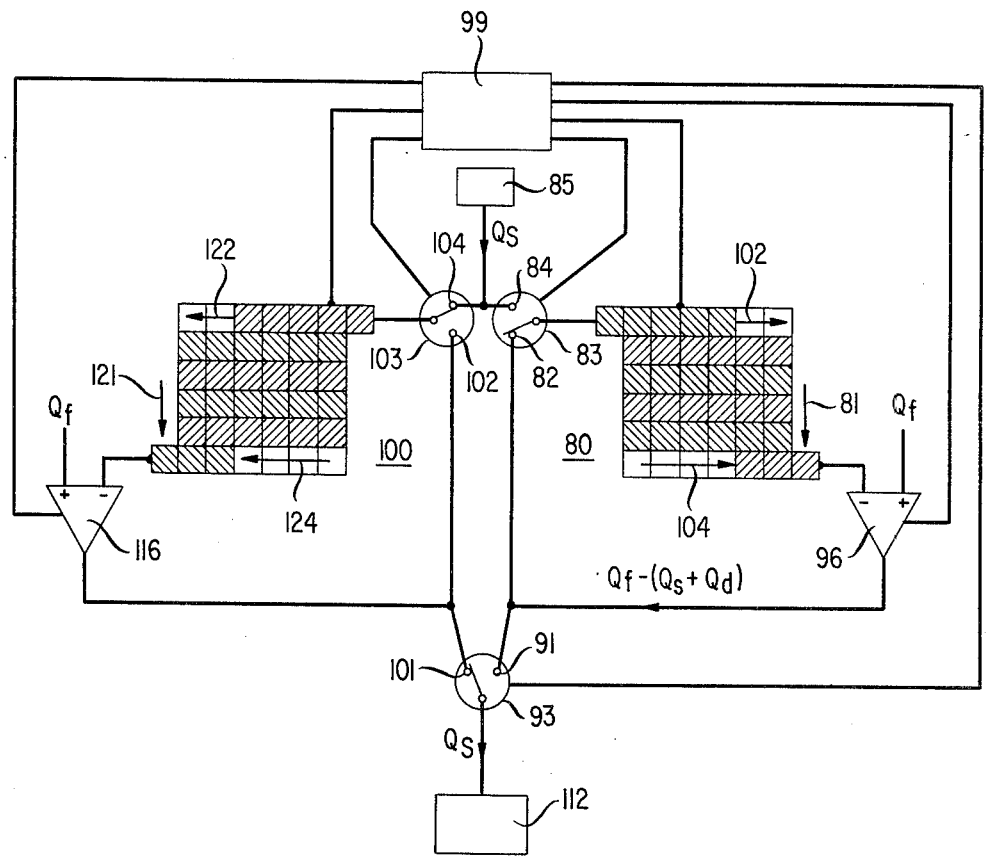
FIG. 4 is a schematic diagram of a pair of serial-parallel-serial semiconductor charge transfer devices with dark current background and continuous data stream input, in accordance with yet another illustrative embodiment of the invention.

It should be noted that the device 50, however, is fed information in the form of charge packets from the input source 55 only during one-half of the clock pulse cycles which drive the device 50. Moreover, whole row lines of output are fed to terminal 61 for utilization only during the same one-half of the clock cycles. Thus, the input and output are both discontinuous, that is, they are delivered only during alternate clock pulse cycles when a single whole row is being fed in at the top line and another single whole row is being removed at the bottom line. In order to provide more nearly continuous input and output, an arrangement shown in FIG. 4 is advantageous. In this FIG. 4, there is shown a pair of substantially identical serial-parallel-serial semiconductor charge transfer devices 80 and 100, each similar or identical to the device 50 previously described in conjunction with FIG. 3. Many of the elements associated with the device 80 are similar or identical to those previously described in FIG. 3 and have accordingly been assigned the same reference numerals as in FIG. 3 plus thirty; and likewise the reference numerals associated with the similar device 100 are the same as in FIG. 3 plus fifty. The shading of cells is of the same significance as in FIG. 3. The pair of single pole-double throw switches 83 and 93 are controlled by clock voltage control means 99 so that while one of these switches connects one of devices 80 or 100, respectively, for the duration of a whole single row line cycle to the input signal source 85 by way of terminal 84 or 104, respectively, the other of these switches connects the other of the devices 100 or 80, respectively, to the feedback loop from difference amplifier 116 or 96, respectively, through switch 103 or 83, respectively, via terminal 102 or 82, respectively (the first switching alternate of each case being the one shown in FIG. 4). Also, output to utilization means 112 is obtained through switch 93 via terminal 91 or 101, respectively, from device 80 (as shown in FIG. 4) or 100 (during next succeeding full line cycle following the condition shown in FIG. 4). During the next succeeding whole row line cycle, it should be understood that switches 83, 103 and 93 are all thrown into their other throw terminal positions. Thus, the above-described controlled throws of switches 83, 103 and 93 produce an overall continuous line-by-line write-in by input source 85 and readout by utilization means 112 after delay in transfer devices 80 and 100.

It should be understood that the above-described devices 10, 20, 50 and 80 with 100 can advantageously be integrated in the same semiconductor wafer, typically of monocrystalline silicon, with suitable electrodes to define desired charge packet transfer paths, together with their corresponding input and output switches 13 with 23, 33 with 43, 53 with 63, 83 and 103 with 93, respectively, all in the same wafer in accordance with integrated circuit techniques. These switches can be conveniently realized as insulated gate field effect transistors whose gates are controlled by the clock control means. The devices 50, 80 and 100 can each take the form of serial-parallel-serial charge coupled device as, for example, described in *Electronics*, p. 91 at pp. 96–97 (Aug. 8, 1974). In the integrated device, it should be understood that some of the terminals may not be exposed for external access after the device has been completely fabricated.

While the invention has been described in terms of specific embodiments, various modifications can be made without departing from the scope of the invention. For example, germanium can be used as the semiconductor wafer instead of silicon, and three or more clock phase cycle type of transfer devices can be used in the practice of the invention.

Instead of writing and reading alternate whole row lines in succession, the switching in FIG. 4 can be arranged for writing and reading entire M×N arrays of information in succession ("frame store"). In order to accomplish this type of (frame store) operation, the switches 83, 93 and 103 are controlled to produce the inverted feedback of an entire array of M × N packets in succession to one configuration, while the other configuration simultaneously is feeding to utilization means an entire array of M × N packets after their second passage and is being fed freshly injected packets controlled by the signal source. Thereby, the utilization means receives whole frame stores alternating from one entire M × N frame store in one configuration and from the other. This type of alternating whole frame store sequence in serial-parallel-serial devices is preferable to the earlier described alternating row line sequence in cases where less frequency switching of the switches 83, 93 and 103 is desired.

This invention can also be practiced with two or three (or more) phase semiconductor charge transfer devices in conjunction with switching means for periodically feeding back signal from a single output terminal of a transfer path or transfer paths in the device to a single input terminal of the path in the device during a first sequence of disjoint (nonoverlapping) time intervals, and for delivering to utilization means the output signals at the output terminal corresponding to charge packets which have undergone two passages through the same transfer path, the charges in the packets during the second passage being injected into the path in an inverted relation relative to the first passage, while the delivery of output from the path to the utilization means occurs after each second passage during a second sequence of time intervals alternating (interlaced) with the first sequence of time intervals, and signals from a signal source are applied to the input terminal of the transfer path during a third sequence (which can be identical to the second sequence) of time intervals also interlacted with the first sequence.

Finally, it should be noted that the inverting means can be located solely in the feedback loop, that is for example in FIG. 1, the difference (inverting) amplifier 26 can be located between terminal 24 of switch 23 and terminal 12 of switch 13; in which case the signal delivered to the utilization means will be proportional to ($Q_f - Q_s$) rather than $Q_s$. It may then be useful to add another amplifier between terminal 21 of switch 23 and the utilization means 22, or to add a noninverting amplifier between terminal 20 of the device 10 and terminal 25 of the switch 23.

What is claimed is:
1. Semiconductor apparatus which comprises:
   a. a semiconductor charge transfer device having a single input transfer device terminal and a single output transfer device terminal;
   b. an inverter having an inverter output terminal, said output device terminal connected to an input terminal of the inverter;
   c. a single input signal source terminal;
   d. an input feedback terminal;
   e. an output feedback terminal connected to the input feedback terminal;
   f. first electrical switching means for connecting the input device terminal in periodic alternate succession to one of the input signal source terminal and the input feedback terminal;
   g. second electrical switching means for connecting the inverter output terminal alternately to one of a utilization means terminal and the output feedback terminal which is connected to the input feedback terminal; and
   h. clock cycle means for producing periodic cycles of charge transfer in the device and for controlling the first and second switching means, each cycle comprising a phase from each of a first and second periodic sequence of clock phases, such that the inverter output terminal is connected to the input device terminal through the input feedback terminal during the first periodic sequence of clock phases and is connected to the utilization means during the second periodic sequence of clock phases interlaced with and complementary to the first sequence, and such that the input device terminal is connected to the input signal source during said second sequence of clock phases.

2. Apparatus according to claim 1 in which the device is a linear path semiconductor transfer device.

3. Apparatus according to claim 2 in which the charge transfer device is integrated in a silicon semiconductor wafer.

4. Apparatus according to claim 1 in which the first sequence is essentially every other first number of half cycles, each cycle comprising a phase from each of the first and second sequence, and the device includes a serial-parallel-serial charge semiconductor device having the first number of columns.

5. Semiconductor apparatus which includes:
   a. a first semiconductor charge transfer device having a single first device's input terminal and a single first device's output terminal, said first device's output terminal being connected to an input terminal of a first inverter having a first inverter's output terminal;

b. a second charge transfer device with a second similar set of single input and single output device terminals similarly connected to a similar second inverter;

c. first electrical switching means for connecting the first device's input terminal to a single input signal source terminal during a first sequence of time intervals and to the first inverter's output terminal during a second sequence of time intervals interlaced and nonoverlapping with the first sequence;

d. second electrical switching means for connecting the first inverter's output terminal to a utilization means terminal during the first sequence of time intervals when the first switching means connects the first device's input terminal to the single input signal source terminal, and for connecting the second inverter's output terminal to the utilization means during time intervals complementary to those of the first sequence; and e. third switching means for connecting the second device's input terminal to the second inverter's output terminal during time intervals complementary to the time intervals of the second sequence.

6. Apparatus according to claim 5 in which the first and second devices are serial-parallel-serial types of transfer devices.

7. Apparatus according to claim 5 in which the first and second devices are linear path transfer devices.

8. Apparatus according to claim 5 in which the first and second charge transfer devices are integrated in a single semiconductor wafer.

* * * * *